(12) United States Patent
Rutter

(10) Patent No.: US 7,205,821 B2
(45) Date of Patent: Apr. 17, 2007

(54) DRIVER FOR SWITCHING CIRCUIT AND DRIVE METHOD

(75) Inventor: Philip Rutter, Stockport (GB)

(73) Assignee: NXP, B.V., Eindhoven (NL)

( * ) Notice: Subject to any disclaimer, the term of this patent is extended or adjusted under 35 U.S.C. 154(b) by 59 days.

(21) Appl. No.: 10/536,247

(22) PCT Filed: Nov. 19, 2003

(86) PCT No.: PCT/IB03/05291

§ 371 (c)(1),
(2), (4) Date: May 24, 2005

(87) PCT Pub. No.: WO2004/051851

PCT Pub. Date: Jun. 17, 2004

(65) Prior Publication Data

US 2006/0038545 A1 Feb. 23, 2006

(30) Foreign Application Priority Data

Nov. 29, 2002 (GB) .................... 0227792.9

(51) Int. Cl.
H03K 17/687 (2006.01)

(52) U.S. Cl. .................. 327/427; 327/108; 363/98

(58) Field of Classification Search ............. 363/21.06, 363/89, 20, 21.01, 44, 52, 84, 56–58, 132; 327/427, 436, 104, 108; 307/254, 262, 571, 307/572

See application file for complete search history.

(56) References Cited

U.S. PATENT DOCUMENTS

| 5,093,771 | A | * | 3/1992 | Harvest | ...................... | 363/98 |
| 5,408,150 | A | * | 4/1995 | Wilcox | ...................... | 327/108 |
| 5,479,089 | A | | 12/1995 | Lee | | |
| 6,396,250 | B1 | | 5/2002 | Bridge | | |

FOREIGN PATENT DOCUMENTS

| WO | WO 9849607 | 11/1998 |
| WO | WO 02063752 A2 | 8/2002 |

* cited by examiner

Primary Examiner—Rajnikant B. Patel
(74) Attorney, Agent, or Firm—Peter Zawilski

(57) ABSTRACT

A driver circuit includes monitoring circuitry (32, 34, 36) for monitoring the states of high and low side switches (6, 8). The driver circuit has an adjustable delay for turning on the transistors (6, 8). The delay is decreased when the monitoring circuit detects that a voltage corresponding to one transistor passes a predetermined voltage V1 before a voltage corresponding to the other transistor passes another predetermined point V2, and vice versa.

13 Claims, 4 Drawing Sheets

DRIVER FOR SWITCHING CIRCUIT AND DRIVE METHOD

The invention relates to switching circuit, drive circuitry for such a circuit and a method of driving a switching circuit, and particularly but not exclusively to a switching voltage converter circuit.

A wide variety of switching regulators are commonly used to generate voltages.

One type of converter, a synchronous dc-dc converter, is illustrated schematically in FIG. 1. An input voltage $V_{in}$ is applied between input terminals 2,4. A pair of transistors, here field effect transistors 6,8, are connected between the input terminals 2,4. The transistor 6 adjacent to the input terminal 2 is known as the control FET or high side transistor, and the transistor 8 adjacent to the ground is known as the synchronous (sync) FET or low side transistor. The high side is relatively more positive than the low side, though it is not necessary that either the high or the low side has any particular relationship to ground.

The node between the transistors 6, 8 is known as the switch node 10. The switch node feeds through an inductor 12 and across a capacitor 14 to an output 16.

A control circuit 18 has one input on an input control terminal 20 and another input fed from the output 16 via a feedback path 21. The control circuit 18 supplies control signals to control the FETs 6,8 to maintain a constant voltage at the output by switching transistors 6,8 off and on alternately. The control signals are alternating signals which cause the control and sync FETs to conduct alternately. The mark-space ratio is varied, i.e. the ratio of the time for which the control FET conducts to the time the sync FET conducts is modulated, to achieve the desired voltage on the output 16.

Examples of such dc—dc converters include those presented in WO98/49607 to Intel Corporation and U.S. Pat. No. 5,479,089 to Lee.

One feature of synchronous dc—dc converters is that it is not generally desired to switch on both high and low side transistors 6,8 simultaneously. If both transistors are on, the input voltage is short-circuited by current passing directly between the two input terminals 2,4 through the control and sync FETs. The phenomenon is known as "shoot-through". Accordingly, the control circuit 18 is generally arranged to ensure that only one of the two transistors 6,8 is on at a time.

This is conventionally carried out by monitoring two voltages. The voltage at the switch node 10 is monitored to prevent the switching on of the low side transistor 8 until the high side transistor 6 is switched off. The voltage at the gate of the low side transistor 8 is monitored to prevent the high side transistor switching on until the low side transistor 8 is switched off. WO98/49607 describes a circuit of this type, as does U.S. Pat. No. 5,479,089 to Lee.

The dead time when neither FET is conducting depends on the transistor threshold voltage and the capacitance of the sync FET, which vary widely due to manufacturing spread of parameters of the chosen FET, as well as according to the individual choice of FET. This means that a control IC has to use conservative estimates of these parameters to produce a dead time that will avoid shoot through. This is generally a longer dead time than would be possible if the control circuit were optimised for the specific FETs used.

The present trend is to increase switching and clock speeds, which increases the significance of the dead time during which neither high or low side transistor 6,8 is on. It would be beneficial to reduce this time.

One circuit that aims to reduce this dead time is that described in WO02/063752 to Philips. The voltage on the drive node 10 is monitored and compared with a predetermined voltage, generally of opposite sign to the output voltage. When the control FET 6 switches off, the inductor continues to draw current through the parasitic body diode of the sync FET 8. The body diode drops about 0.6V, and so assuming that the input and output voltages are positive, the voltage at the drive node 10 becomes negative when the control FET is switched off. WO02/063752 accordingly uses the voltage at the drive node falling below a predetermined value to trigger the turning on of the sync FET to ensure that the sync FET is not switched on until the control FET is switched off.

However, although such a circuit reliably avoids shoot through, there remains an appreciable dead time, when neither FET is switched on, of at least the delay time of the driver plus the turn-on time of the FET. This dead time is about 30 ns using current technology.

Another approach is described in U.S. Pat. No. 6,396,250. In this circuit, controllable delays are provided on the inputs to gate transistors, controlled by a feedback loop with the signal taken from the switch node. The inventors have realised that although this circuit delivers some benefits there are disadvantages from taking the control signal from the switch node in this way.

As switching speeds increase still further, it would be beneficial to reduce the dead time as much as possible.

Accordingly, in one aspect there is provided a drive circuit for a switching circuit, comprising: first and second gate control outputs for connection to the gates of respective first and second insulated gate transistors; first and second gate drivers connected to the first and second gate control outputs respectively for driving the respective gates to switch the first and second insulated gate transistors on and off alternately; and monitoring circuitry for monitoring the voltages on first and second monitor points and hence the state of the first and second transistors respectively, the first monitor point being one of the first gate control output and a switch node between first and second transistors and the second monitor point being the second gate control output, wherein the drive circuitry is arranged: to drive the second gate driver to switch off the second insulated gate transistor and then after a controllable delay D to drive the first gate driver to switch on the first insulated gate transistor; to compare the time that the voltage on the first monitor point passes a first predetermined voltage and the time that the voltage on the second monitor point passes a second predetermined voltage; and to decrease the delay D if the second time is before the first time and to increase the delay D if the second time is after the first time.

The circuitry allows the dead time to be reduced to a minimum without needing excessively complex additional circuitry.

By using timing information related to each transistor separately rather than by just taking a feedback signal from the switch node as in U.S. Pat. No. 6,396,250 the circuit can track the turn on times of each transistor in a consistent and reliable manner.

The transistors may be connected in series at a switch node. The first monitor point may be the switch node. Alternatively, the first monitor point may conveniently be the first gate. The benefits of these approaches will be defined in more detail below.

The delay D may be increased or decreased by a predetermined amount. The predetermined amount may be in the range 0.5 ns to 10 ns, preferably 1 ns to 5 ns. By using a predetermined amount in this range, especially in the preferred range, the deadtime can be reduced to zero even as changes in operating currents and temperature during operation affect the switching time of the components—the system is capable of adjusting rapidly enough to cope with these variations. Further, this range allows good stability. If the delay is decreased in steps that are too large, then the gate signals may overlap to such and extend that both FETs will be fully on and "shoot through" will occur, thus increasing losses. Therefore, the steps must be small enough to avoid significant shoot through.

Alternatively, the delay D can be varied by a variable amount—for example the greater the time difference between the first and second times the more D may be adjusted on each cycle.

The predetermined voltages may be selected based on the components used for the insulated gate field effect transistors.

The first and second predetermined voltages may be in the range 1V to 2V; this voltage allows good control for a variety of output voltages. In circuits operating only at higher voltage range, the predetermined voltages may vary more widely. For example, for a 12V output, the predetermined voltage may be in the range 1V to 10V.

The voltages may be the same, and may preferably be at a level roughly corresponding to the threshold voltages of the transistors.

For a p-channel insulated gate transistor, the corresponding predetermined voltage may be 1V to 2V below the p-channel source voltage.

In a preferred embodiment, the drive circuit is arranged: to switch off the second one of the insulated gate transistors and after a second delay E to switch on the first one of the insulated gate transistors; to compare the time that the voltage on the first gate control output passes a third predetermined voltage and the time that the voltage on the second gate control output passes a fourth predetermined voltage; and to decrease the second delay E if the fourth time is after the third time and increasing the second delay E if the fourth time is before the third time. This enables the drive circuitry to set the delay D to be different from the second delay E, thereby allowing the delays for the first and second transistors to be set separately.

Conveniently, the third voltage equals the first voltage and the fourth voltage equals the second voltage.

The invention also relates to a switching circuit comprising a drive circuit as set out above and upper and lower insulated gate transistors each having gate, source and drain, the gates of the upper and lower insulated gate transistors being connected to corresponding gate control outputs of the drive circuitry.

The predetermined voltages may be within 1V of the threshold voltage of the insulated gate transistors.

In embodiments, the first monitor point is the first gate control output. This symmetrical arrangement avoids the need for a separate connection to the switch node, since the drive circuit has both the first and second gate control outputs available within it. Also, by not needing to monitor the switch node difficulties with noise at the switch node are avoided.

In an alternative embodiment the first monitor point is the switch node. Taking the first transistor to be the high side transistor, the source of the first transistor effectively floats on the oscillating switch node voltage, meaning that the gate source voltage shifts relative to ground. By monitoring the switch node instead of the gate voltage there is no need to take account of the varying reference voltage of the high side transistor. Moreover, variations in the threshold voltage of the first transistor no longer need to be taken into account.

Preferably, the predetermined voltages are in the range 1V to 2V with respect to the ground of the low side transistor—this range allows the driver to work with as wide a range of conversion (output) voltages respectively.

In another aspect there is provided a switching converter circuit with control and sync insulated gate transistors each having gate, source and drain, the control and sync insulated gate transistors being connected together in series with a switch node for driving a load insulated gate transistors; and drive circuitry connected to the gates of the insulated gate transistors for switching the control and sync insulated gate transistors on and off alternately, wherein the drive circuitry is arranged: to switch off the sync insulated gate transistor and switch on the control insulated gate transistors after a delay D; to monitor the voltages at first and second monitor points, the first monitor point being the switch node or the gate voltages of the control transistor and the second monitor point being the gate voltage of the sync transistor; to compare the time that the voltage on the first monitor point falls below a first predetermined voltage and the time that the voltage on the second monitor point rises above a second predetermined voltage; and to decrease the delay D if the second time is after the first time and to increase the delay D if the second time is before the first time.

In a further aspect, the invention relates to a method of driving a converter circuit having control and sync insulated gate transistors each having gate, source and drain, the upper and lower insulated gate transistors being connected together in series and having a switch node therebetween for connection to a load; the method including the steps of: (a) switching off a first one of the insulated gate transistors; (b) switching on the second one of the insulated gate transistors after a delay D; (c) monitoring the voltages at first and second monitor points, the first monitor point being one of the gate of the first transistor and the switch node and the second monitor point being the gate of the second transistor; and (d) comparing the time that the voltage on the first monitor point passes a first predetermined voltage and the time that the voltage on the second monitor point passes a second predetermined voltage; (e) decreasing the delay D if the second time is after the first time and increasing the delay D if the second time is before the first time; and (f) switching on the first and second transistors alternately, repeating steps (a) to (e) above when switching on the second transistor and switching off the first transistor.

For a better understanding of the invention, embodiments of the invention will now be described, purely by way of example, with reference to the accompanying drawings, in which.

Figure 3A:
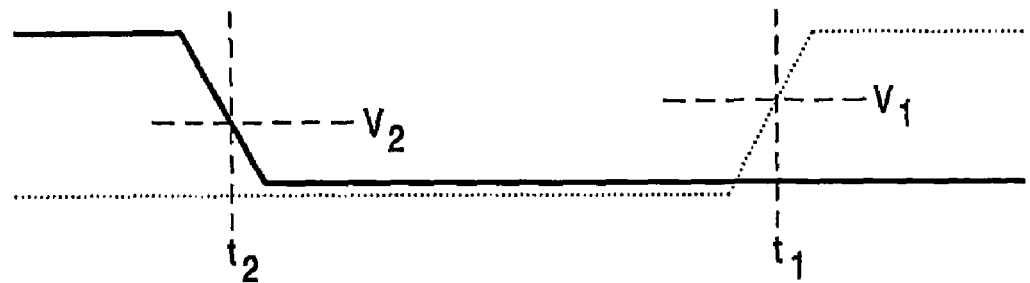
Figure 3B:
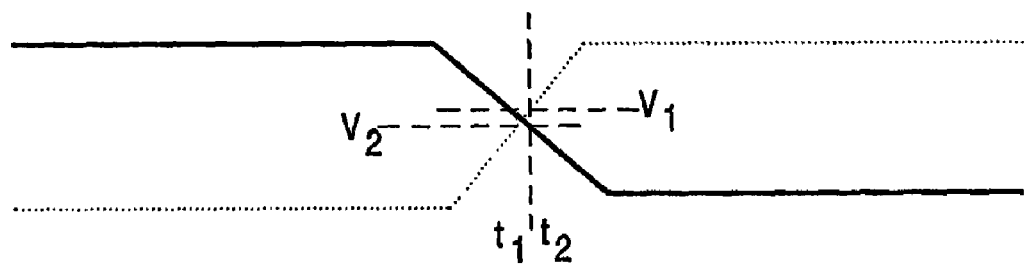
Figure 3C:
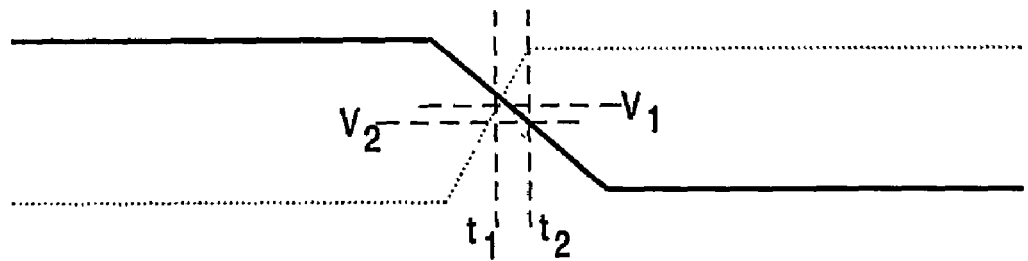

FIGS. 3(a) to 3(c) show voltages in the first embodiment of the invention; and

Figure 4:
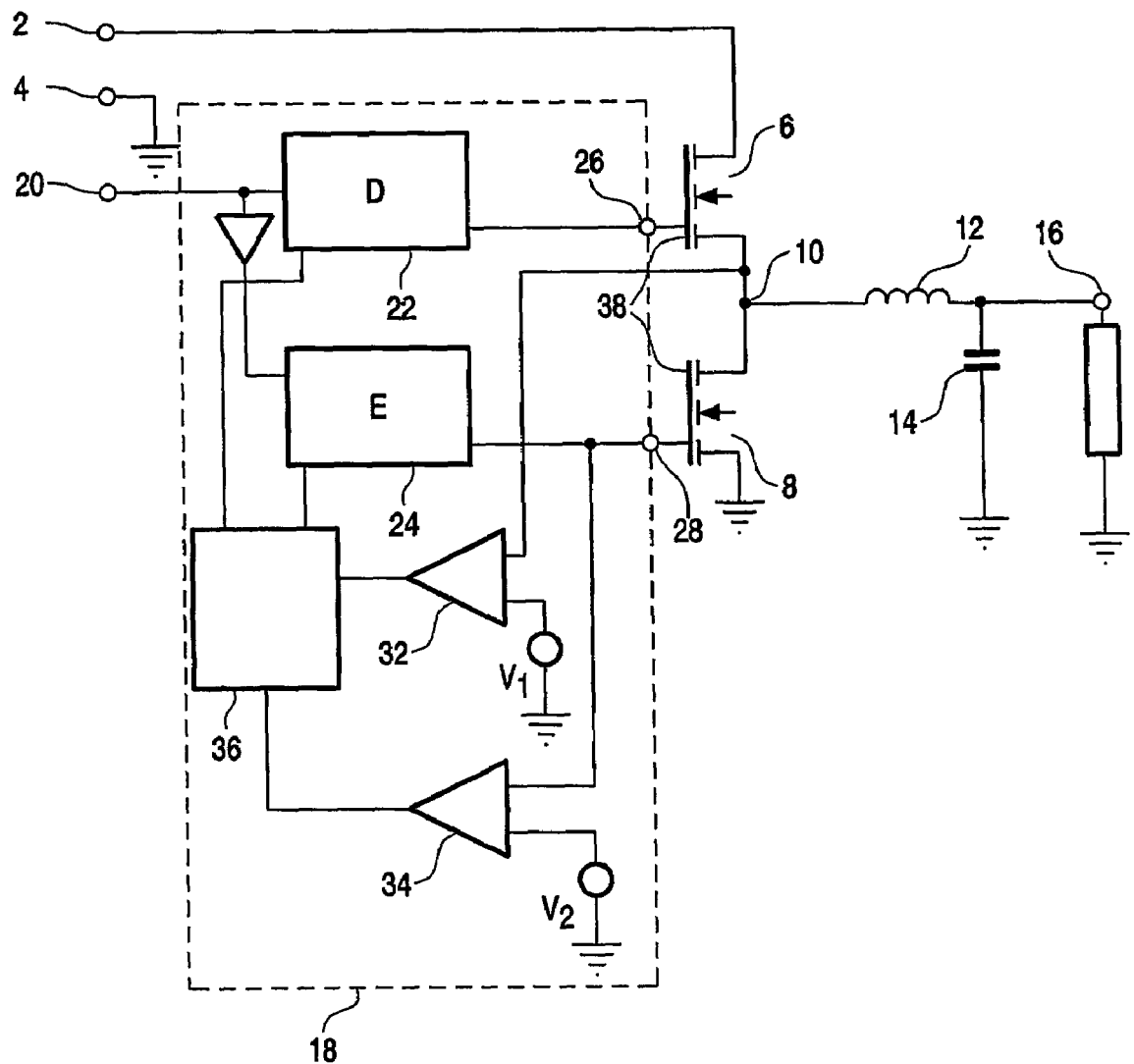

FIG. 4 shows a second embodiment of the invention.

Figure 1:
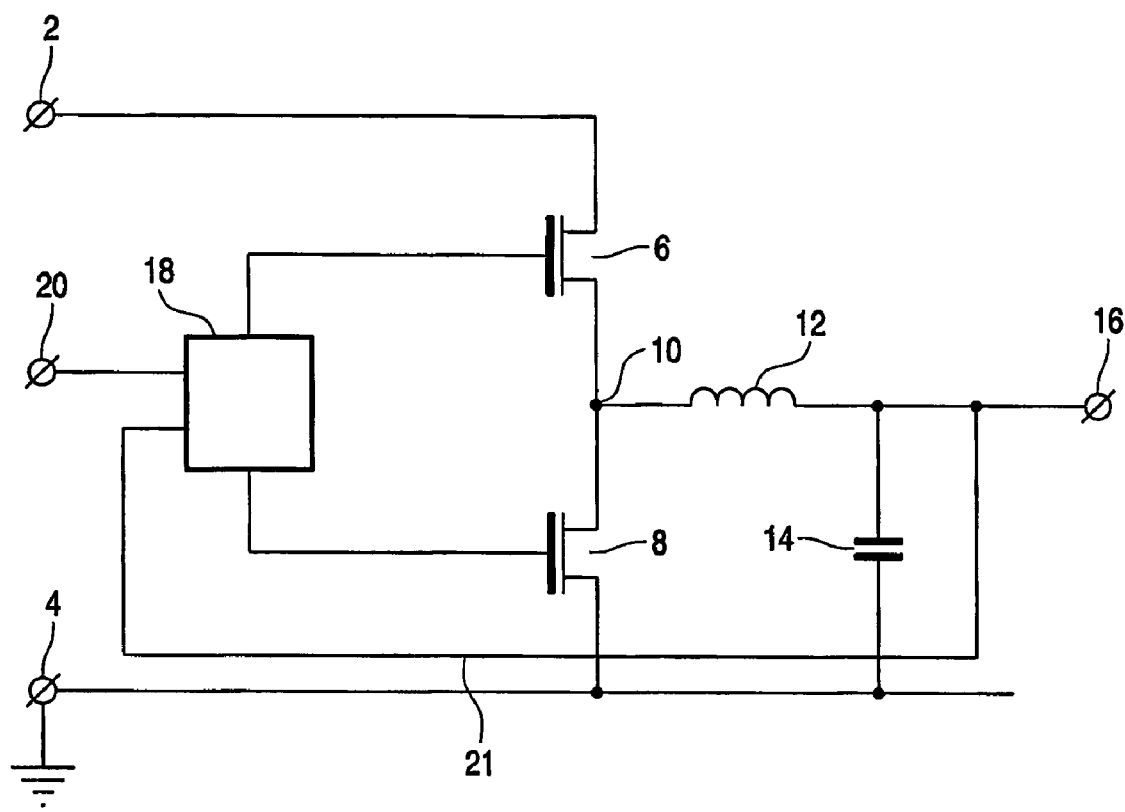
FIG. 1 shows a prior art buck converter circuit.
Figure 2:
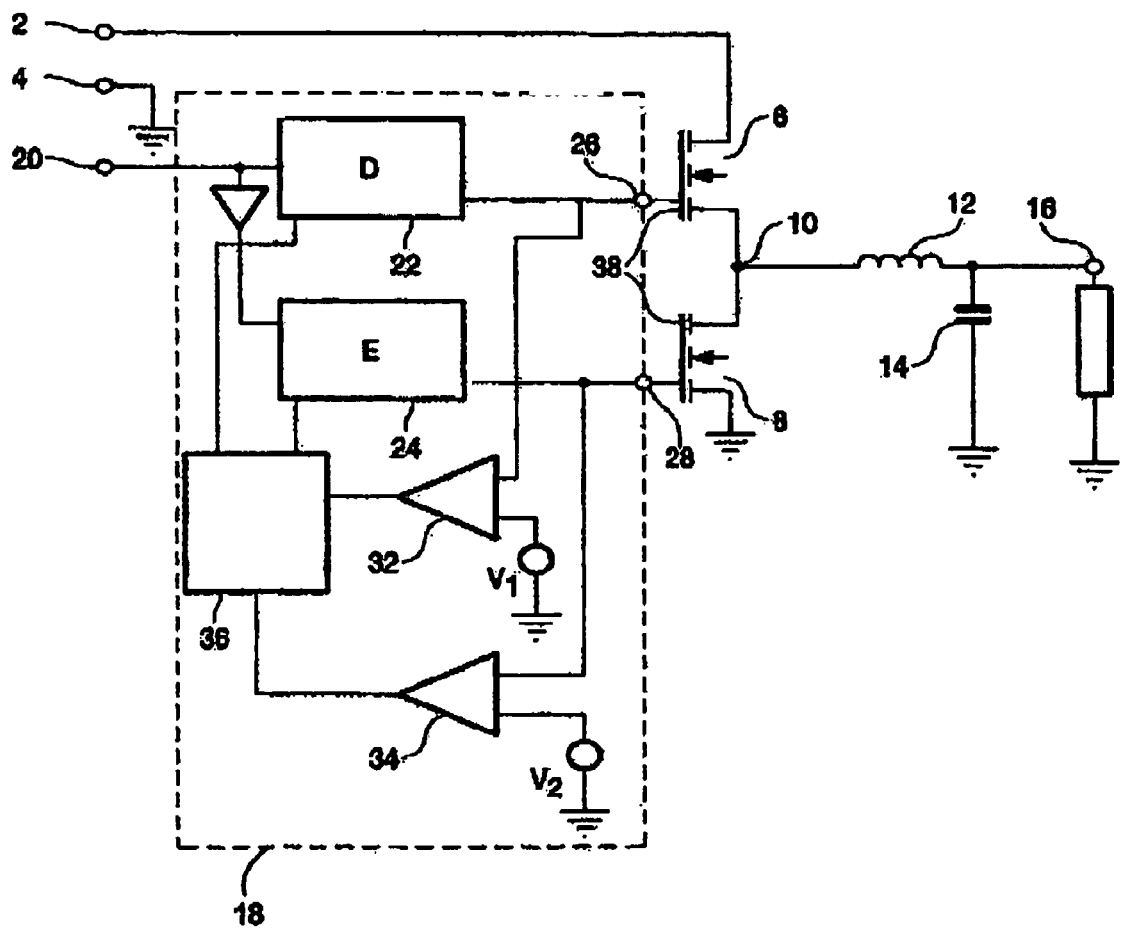
FIG. 2 shows a switching converter circuit according to a first embodiment of the invention.

Referring to FIG. 2, a high-side (control) FET 6 is connected via switch node 10 in series with a low-side (sync) FET 8 between a high-side line connected to high-side input terminal 2 and ground connected to low-side input terminal 4. Switch node 10 is connected through inductor 12 and across capacitor 14 to output 16 which may be connected to a load. The load may be, for example, a micro processor.

Drive circuitry 18 drives the gates 38 of the high-side 6 and low-side 8 FETs. An input signal is provided on terminal

20. In this embodiment, the input signal is a pulse-width modulated signal generated by a suitable generator. The generator is not shown in the drawings since suitable generation schemes are well known to the skilled person. The generation scheme may in particular use feedback from output 16 to control the mark-space ratio of the signal input at terminal 20 and hence to control the voltage output at output 16.

A first gate driver circuit 22 and a second gate driver circuit 24 are arranged to provide suitable signals on first and second gate control outputs 26, 28. These are connected in turn to the gates of the high-side FET 6 and the low-side FET 8 respectively. The gate drivers 22, 24 both include circuitry to turn off the respective transistor in response to a signal pulse on signal input 20, and to turn on the respective transistor after a predetermined delay on receipt of the opposite sign of pulse on signal input 20. Such circuits having a controllable turn-on delay may be made in a number of ways by the skilled person. For example, some circuits are described in U.S. Pat. No. 6,396,250 to Bridge.

First and second comparators 32, 34 are provided connected to first and second gate control outputs 26, 28 respectively. Each compares the voltage on the gate output with a respective predetermined voltage and provide a corresponding output signal to control unit 36. Comparators 32, 34 and control unit 36 accordingly constitute monitoring circuitry for monitoring gate voltages on the FETs 6, 8.

The control unit 36 is connected to the drive circuits 22, 24 to set the programmable turn-on delay in these circuits.

In use, when the low-side FET 8 is turned off the high-side FET 6 is turned on after a programmable delay D. The voltages on the first gate control output 26 connected to high-side FET 6 is shown in FIG. 3a as a dotted line, and the corresponding voltage on second gate control output 28 connected to low-side FET 8 is shown as a solid line.

In the state shown in FIG. 3a, the delay D is sufficiently long that the low-side FET 8 turns off long before the high-side FET 6 turns on. In this case, control unit 36 detects that the gate voltage of low-side FET 8 passes predetermined voltage V2 long before the voltage on first gate control output 26 passes voltage V1. The term "first time" will be used to describe the time relating to the first transistor and the term "second time" with be used to describe the time relating to the second transistor, even though the order of first and second times vary, for example in the initial state the second time is before the first time.

When the control unit 36 determines that the second time is before the first time the delay D is decreased by a predetermined amount of 2 ns. This is repeated on each input cycle of the signal on signal input 20, with the delay being reduced by the predetermined time 2 ns on each cycle until the situation in FIG. 3b is reached in which the first and second times are substantially the same. The voltages V1, V2 are selected so that in this state the dead time is reduced to around 1 to 2 ns which represents a significantly reduced dead time compared to a conventional scheme, which includes the rise time which may typically be of order 12 ns.

As component values change with time, for example as the components warm up, the situation in FIG. 3c may occur in which the second time is after the first time. In this case, control circuitry 36 increases the delay to avoid shoot-through.

A corresponding feedback loop is used to turn on the second transistor and turn off the first transistor. A separate turn-on delay E is used for the second transistor to take account of the component variation between first and second transistors 6, 8.

When the transistors are switched, the inductance of the connection, i.e. the wires and PCB, between the driver and the transistor in combination with the gate drive current will cause a voltage drop along the connection leading to an error in the sensed gate voltages. Therefore, in a preferred variation the sense connections of comparators 32, 34 may be connected directly to the insulated gates of the transistors through separate connections to the connection carrying the gate drive current. Alternatively, in a multichip module implementation the comparators may be integrated in the same package as the insulated gate transistors and directly connected thereto.

In a second embodiment of the invention, the input to the first comparator 32 is taken from the switch node 10 instead of the first control output 26. This is shown in FIG. 4.

This works since when the high-side FET 6 is switched on the voltage on the switch node 10 rises from about −0.5V to the input voltage. Turning off the high-side FET 6 causes the switch node 10 to fall from the input voltage to about −0.5V. The reference voltage can therefore be any point between 0V and the conversion voltage, but preferably between 1 and 2V to allow the drive circuitry to work for as wide a range of conversion voltages as possible and to give a level of noise immunity, since the switch node 10 is inevitably noisy.

The benefit of the approach of FIG. 4 is that threshold voltage variations of the control FET are no longer relevant. A second advantage is that the gate-source voltage of the high-side FET 6 is referenced to a source that floats high when the FET is turned on and floats low when the FET is turned off. This makes it more difficult to monitor the gate voltage signal of the high-side FET 6. By monitoring the switch node as an alternative to the gate of the high-side FET there is no such difficulty.

From reading the present disclosure, other variations and modifications will be apparent to persons skilled in the art. Such variations and modifications may involve equivalent and other features which are already known in the design, manufacture and use of the switching circuit and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, the embodiments described use the approach of the invention for turning on both transistors, but it is possible to use the approach only for turning on one transistor, and not the other.

There is no need for both the transistors to be n-channel. For example, the control FET could be p-channel. In this case, the predetermined reference voltage would be about 1V–2V lower than the threshold voltage of this transistor.

The described embodiments use steps of constant size to reach the minimum delay. However, this is not an essential feature and the skilled person will readily conceive of alternative approaches. For example, the size of the step can be proportional to the difference in time between the first and second times.

Further, although the described embodiments relate to a switching voltage converter the invention is also applicable to other switching arrangements where switches need to be operated with a minimal delay between operation.

The invention claimed is:

1. A drive circuit for a switching circuit, comprising:
   first and second gate control outputs for connection to gates of respective first and second insulated gate transistors;
   first and second gate drivers connected to the first and second gate control outputs respectively for driving the respective gates to switch the first and second insulated gate transistors on and off alternately;
   monitoring circuitry for monitoring voltages on first and second monitor points and hence a state of the first and second insulated gate transistors respectively, the first monitor point being one of the gate of the first insulated gate transistor and a switch node between first and second insulated gate transistors and the second monitor point being the gate of the second insulated gate transistor;
   wherein the drive circuit is arranged:
   to drive the second gate driver to switch off the second insulated gate transistor and then after a first controllable delay to drive the first gate driver to switch on the first insulated gate transistor;
   to compare a first time that the voltage on the first monitor point passes a first predetermined voltage and a second time that the voltage on the second monitor point passes a second predetermined voltage; and
   to decrease the first controllable delay if the second time is before the first time and to increase the first controllable delay if the second time is after the first time.

2. A drive circuit according to claim 1 wherein the first monitor point is the first gate control output and the second monitor point is the second gate control output.

3. A drive circuit according to claim 1 wherein the first and second insulated gate transistors are connected together in series at a switch node and the first monitor point is the switch node.

4. A drive circuit according to any preceding claim wherein every time the first controllable delay is increased or decreased the first controllable delay is increased or decreased by a constant predetermined time.

5. A drive circuit according to claim 4 wherein the predetermined time is in the range 1 ns to 5 ns.

6. A drive circuit according to claim 1 wherein the drive circuit is arranged:
   to switch off the first insulated gate transistor and after a second controllable delay to switch on the second insulated gate transistor;
   to compare a third time that the voltage on the first monitor point passes a third predetermined voltage and a fourth time that the voltage on the second monitor point passes a fourth predetermined voltage; and
   to decrease the second controllable delay if the fourth time is after the third time and to increase the second delay E if the fourth time is before the third time, so that the drive circuit can set the first controllable delay to be different from the second controllable delay.

7. A drive circuit according to claim 6 wherein the predetermined voltages are within 1V of a threshold voltage of one of the insulated gate transistors.

8. A switching converter circuit, comprising: control and sync insulated gate transistors each having a gate, a source and a drain, the control and sync insulated gate transistors being connected together in series at a switch node for driving a load; and
   a drive circuit connected to the gates of the control and sync insulated gate transistors for switching the control and sync insulated gate transistors on and off alternately;
   wherein the drive circuit is arranged:
   to switch off the sync insulated gate transistor and switch on the control insulated gate transistor after a delay;
   to monitor voltages at first and second monitoring points, the first monitor point being the switch node or the gate of the control transistor and the second monitor point being the gate of the sync transistor;
   to compare the a first time that the voltage en at the first monitoring point rises above a first predetermined voltage and a second time that the voltage at the second monitoring point falls below a second predetermined voltage; and
   to decrease the delay if the second time is before the first time and to increase the delay if the second time is after the first time.

9. A method of driving a converter circuit having first and second insulated gate transistors each having, a gate, a source and a drain, the method including the steps of:
   (a) switching off the first insulated gate transistor;
   (b) switching on the second insulated gate transistor after a first a delay;
   (c) monitoring voltages at first and second monitor points, the first monitor points being one of the gate of the first insulated gate transistor and a switch node that is between first and second insulated gate transistors, and the second monitor point being the gate of the second insulated gate transistor; and
   (d) comparing a first time that the voltage at the first monitor point passes a first predetermined voltage and a second time that the voltage at the second monitor point passes above a second predetermined voltage;
   (e) decreasing the first delay if the second time is after the first time and increasing the first delay if the second time is before the first time; and
   (f) switching on the first and second transistors alternately, repeating steps (a) to (c) above when switching on the second transistor and switching off the first transistor.

10. A method according to claim 9 further comprising:
    (g) switching off the second insulated gate transistor and switching on the first insulated gate transistor after a second delay;
    (h) monitoring the voltages at the first and second monitor points;
    (i) comparing a third time that the voltage at the second monitor point falls below a third predetermined voltage and a fourth time that the voltage at the first monitor point rises above a fourth predetermined voltage;
    (j) decreasing the second delay if the fourth time is after the third time and increasing the second delay if the fourth time is before the third time; and
    repeating steps (g) to (j) above when switching on the first insulated gate transistor and switching off the second insulated gate transistor as the first and second insulated gate transistors are switched on alternately.

11. A method according to claim 9 or 10 wherein the first delay and the second delay are increased or decreased by a predetermined amount in the range 1 ns to 5 ns on each cycle.

12. A method according to claim 9 or 10 wherein the first monitor point is the gate of the first insulated gate transistor.

13. A method according to claim 9 or 10 wherein the first and second insulated gate transistors are connected together in series and have a switch node therebetween for connection to a load, and in which the first monitor point is the switch node.

* * * * *